(12) United States Patent
Yamaguchi

(10) Patent No.: US 11,109,521 B2
(45) Date of Patent: Aug. 31, 2021

(54) PRODUCTION MANAGEMENT SYSTEM OF COMPONENT MOUNTING LINE

(71) Applicant: FUJI CORPORATION, Chiryu (JP)

(72) Inventor: Hideyuki Yamaguchi, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 235 days.

(21) Appl. No.: 16/315,806

(22) PCT Filed: Jul. 20, 2016

(86) PCT No.: PCT/JP2016/071241
§ 371 (c)(1),
(2) Date: Jan. 7, 2019

(87) PCT Pub. No.: WO2018/016018
PCT Pub. Date: Jan. 25, 2018

(65) Prior Publication Data
US 2019/0150336 A1 May 16, 2019

(51) Int. Cl.
*H05K 13/08* (2006.01)
*H05K 13/04* (2006.01)

(52) U.S. Cl.
CPC ......... *H05K 13/083* (2018.08); *H05K 13/041* (2018.08); *H05K 13/0409* (2018.08); *H05K 13/084* (2018.08); *H05K 13/0812* (2018.08)

(58) Field of Classification Search
CPC ............ H05K 13/0409; H05K 13/041; H05K 13/0812; H05K 13/083; H05K 13/084
See application file for complete search history.

(56) References Cited

U.S. PATENT DOCUMENTS 6,079,098 A * 6/2000 Soellner ............ H05K 13/0495
29/832
6,973,713 B1 * 12/2005 Huber .................. H05K 13/089
29/740

(Continued)

FOREIGN PATENT DOCUMENTS

| JP | 2006-108540 A | 4/2006 |
| JP | 2006-313838 A | 11/2006 |
| JP | 2009-88035 A | 4/2009 |

OTHER PUBLICATIONS

International Search Report dated Oct. 11, 2016 in PCT/JP2016/071241 filed Jul. 20, 2016.

*Primary Examiner* — Minh N Trinh
(74) *Attorney, Agent, or Firm* — Oblon, McClelland, Maier & Neustadt, L.L.P.

(57) ABSTRACT

A production management system of a component mounting line that includes component mounters that identify a board ID of a circuit board conveyed during production, send the board ID to a production management computer of the production management system, measure actual data for early-stage-discovery of a mounting defect at a specified interval during production, and send the measurement results to the production management computer. The production management computer saves the board IDs sent from each of the component mounters with a time stamp, monitors whether there is a possibility of a mounting defect based on the measurement result, extracts board IDs of circuit boards on which components were mounted at the component mounters since the previous time measurement was performed if there is the possibility of a mounting defect, and displays a list of the circuit boards with a possible mounting defect.

7 Claims, 7 Drawing Sheets

(56) References Cited

U.S. PATENT DOCUMENTS

| | | | |
|---|---|---|---|
| 7,571,539 B2* | 8/2009 | Maenishi | H05K 13/084 29/834 |
| 8,140,176 B2* | 3/2012 | Sumi | H05K 13/084 700/116 |
| 9,668,395 B2* | 5/2017 | Morita | G06K 19/06046 |
| 2007/0276867 A1 | 11/2007 | Fishbaine et al. | |
| 2009/0119904 A1 | 5/2009 | Yamasaki et al. | |
| 2011/0218754 A1 | 9/2011 | Mori | |
| 2019/0150336 A1* | 5/2019 | Yamaguchi | H05K 13/084 29/739 |

* cited by examiner

PRODUCTION MANAGEMENT SYSTEM OF COMPONENT MOUNTING LINE

TECHNICAL FIELD

The present disclosure relates to a production management system of a component mounting line configured from multiple component mounters arranged in a line on a conveyance path along which a circuit board is conveyed, wherein in each component mounter components supplied from a component supply device are picked up by a suction nozzle and mounted on the circuit board.

BACKGROUND ART

Generally, in component mounters, for example, as disclosed in patent literature 1 (JP-A-2006-313838) and patent literature 2 (JP-A-2009-88035), when picking up a component with a suction nozzle, or when mounting the component on a board, to prevent damage to the component due to impact, a suction nozzle is provided to be vertically movable in a nozzle holder, and the suction nozzle is biased downwards by a spring; after the lower end of the suction nozzle contacts the component during component pickup operation, and after the component held by the suction nozzle contacts the board during component mounting operation, the suction nozzle is pushed against the elastic force of the spring in accordance with the lowering operation of the mounting head that holds the nozzle holder until the lowering operation stops, thereby lessening the impact on the component.

However, if the ability of the suction nozzle to slide (move) is worsened due to, for example, foreign matter entering the sliding section between the nozzle holder and the suction nozzle such that the suction nozzle sticks, or if the end section of the suction nozzle is damaged, the stuck or chipped suction nozzle may lead to a component pickup error or a component mounting error, or may lead to damage to the component due to decreased effectiveness of the impact lessening mechanism. Accordingly, when a stuck or damaged suction nozzle occurs, it is necessary to detect this quickly and stop the component mounter.

With respect to this, as disclosed in patent literature 3 (JP-A-2006-108540), there are component mounters provided with a load cell as a means for measuring the ability of a suction nozzle to slide, wherein to measure the sliding ability of the suction nozzle, the suction nozzle is positioned above the load cell and lowered such that the lower end of the suction nozzle contacts the load cell, the contact load (sliding resistance of the suction nozzle) is measured at the load cell, and the measurement value is used to determine whether the suction nozzle is stuck or damaged.

CITATION LIST

Patent Literature

Patent literature 1: JP-A-2006-313838
Patent literature 2: JP-A-2009-88035
Patent literature 3: JP-A-2006-108540

SUMMARY

However, if measurement of the pushing load of a suction nozzle is performed frequently during production, production efficient decreases, thus, with patent literature 3 above, measurement of the pushing load of a suction nozzle is performed only when a suction nozzle is exchanged, or at a specified interval (for example, every two hours), or when a ratio of component pickup errors exceeds a specified value. Therefore, even if a stuck or damaged suction nozzle can be detected from the measurement result of the pushing load of the suction nozzle, it is unknown at what point from the last time a stuck or damaged suction nozzle was detected to the current time at which the new stuck or damaged suction nozzle occurred. Because a component mounting line for producing a component-mounted board is configured from multiple component mounters lined up, when a stuck or damaged suction nozzle is detected at one of the component mounters from the measurement result of the load of the suction nozzle, an operator must estimate the quantity and location (current position) of circuit boards that have been conveyed from the component mounter at which the stuck or damaged suction nozzle was detected to a downstream component mounter since the previous measurement, and perform work of collecting those circuit boards and inspecting whether they have any mounting defects (connection defects, component damage, and the like).

However, it is difficult to estimate the quantity and location of circuit boards for which a mounting defect may have occurred that have been conveyed downstream component mounter since the previous measurement. If the estimate is fewer than the actual quantity of circuit board for which a mounting defect may have occurred, defective circuit boards may be missed; on the other hand, if the estimate is greater than the quantity of circuit boards for which a mounting defect may have occurred, the inspection time will be unnecessarily long, or, if a portion of the circuit boards for which a mounting defect may have occurred has already been sent to another component mounting line, an operator will have a hard time searching for the circuit boards for which a mounting defect may have occurred, meaning that work efficiency is poor.

Thus, an object of the present disclosure is to provide a component mounting line production management system that, at the point at which it is determined from a current measurement result that a mounting defect may have occurred at a component mounter, notifies an operator of a list of circuit boards for which a mounting defect may have occurred that have been conveyed downstream of the component mounter of the measurement result since the time the previous measurement was performed, such that the operator can reliably and easily check the list, thereby enabling the operator to collect and inspect circuit boards for which a mounting defect may have occurred with good efficiency.

To solve the above problems, the present disclosure is a production management system of a component mounting line configured from multiple component mounters arranged in a line on a conveyance path along which a circuit board is conveyed, wherein in each component mounter components supplied from a component supply device are picked up by a suction nozzle and mounted on the circuit board, the production management system including: a production management computer connected to the multiple component mounters via a network such that communication is possible between the production management computer and the multiple component mounters, wherein a board ID recording section on which is recorded or memorized board identification information (hereinafter referred to as "board ID") is provided on the circuit board conveyed in the component mounting line, the multiple component mounters are configured to identify the board ID of the circuit board that is loaded during production and send the board ID to the production management computer, measure actual machine data for early-stage-discovery of a mounting defect at a specified measurement interval during production, and send a measurement result of the measuring to the production management computer, and the production management computer is configured to save the board ID with a time stamp sent from the multiple component mounters for each of the multiple component mounters, monitor whether there is possibility of a mounting defect based on the measurement result of the actual machine data for early-stage-discovery of a mounting defect for each of the multiple component mounters, and when determining that there is a possibility of a mounting defect at any of the component mounters, extract the board IDs of the circuit boards on which components were mounted at the component mounter since a previous time that measurement was performed, based on the measurement interval and the board ID with time stamp, and display a list of the extracted circuit boards as a list of circuit boards for which there is a possibility of a mounting defect.

That is, the production management computer, by saving the board ID sent from the multiple component mounters with a time stamp for each of the component mounters, it is possible to investigate by checking past records the time of production and the board ID of circuit boards mounted with components at each component mounter. Also, the production management computer, upon determining that there is a possibility that a mounting defect occurred at one of the component mounters, references the saved data of the board IDs with time stamp saved for each component mounter, extracts board IDs of circuit boards that were mounted at the component mounters since the previous time measurement was performed, and displays a list of circuit boards for which it is possible that there is a mounting defect. Accordingly, as soon as it is determined that there is a possibility that a mounting defect occurred at one of the component mounters from the current measurement results, an operator can reliably and easily check a list of circuit boards for which there is a possibility of a mounting defect that have been conveyed to a downstream component mounter since the previous measurement was performed, thereby enabling the operator to collect and inspect circuit boards for which a mounting defect may have occurred with good efficiency.

In this case, the longer the interval between measurements for measuring actual data used for early-stage-discovery of a mounting defect, the longer the distance that a circuit board that may have a mounting defect is conveyed, meaning that a portion of the circuit boards for which a mounting defect may have occurred may have already been conveyed outside the component mounting line.

Here, the production management computer may include information of the current location of each of the circuit boards in the list of circuit boards for which there is a possibility of a mounting defect that is displayed. Accordingly, because it is possible for an operator to understand the current location of each circuit board by checking the list of circuit boards for which there is a possibility of a mounting defect, the operator can reliably and easily know to where the circuit boards for which there is a possibility of a mounting defect have been conveyed.

With the present disclosure, the pushing amount of a suction nozzle may be measured as the actual data for early-stage-discovery of a mounting defect, or, the suction nozzle may be imaged from the side by a camera and image processing performed to determine whether the suction nozzle is stuck or damaged. Further, the actual data for early-stage-discovery of a mounting defect is not limited to data related to a stuck or damaged suction nozzle, for example, the actual data may be obtained by measuring a mechanical positioning error amount or the like that causes a mounting defect.

Also, the production management computer may display the list of circuit boards for which there is a possibility of a mounting defect on any type of display device so long as the display device is positioned to be easy for an operator to see, for example, the list of circuit boards for which there is a possibility of a mounting defect may be displayed on a display section of the multiple component mounters that configure the component mounting line.

Further, the production management computer may be configured to, when it is determined that there is a possibility of a mounting defect at any of the component mounters, issue an instruction to stop operation to the component mounter to which the circuit boards included on the list of circuit boards for which there is a possibility of a mounting defect have been loaded. This prevents components being mounted on a circuit board with a mounting defect.

Further, at least one of a mounting head that holds the suction nozzle or the suction nozzle may be exchangeably attached to the multiple component mounters, and a second ID recording section on which identification information (hereinafter referred to as "ID") may be provided on at least one of the mounting head or the suction nozzle, wherein the multiple component mounters may be configured to read the ID from the ID recording section of the at least one of the mounting head or the suction nozzle when the at least one of the mounting head or the suction nozzle is exchanged, and send the read ID to the production management computer, and the production management computer may be configured to save the ID of the at least one of the mounting head or the suction nozzle sent from the multiple component mounters, prohibit use of the at least one of the mounting head or the suction nozzle attached to the component mounter at a time when it is determined that there is a possibility of a mounting defect at any of the component mounters, send the ID of the at least one of the mounting head or the suction nozzle for which use is prohibited to the other component mounters, stop operation of the other component mounters when the at least one of the mounting head or the suction nozzle for which use is prohibited is attached to one of those other component mounters, and to display an indication that operation of that other component mounter has stopped. Accordingly, when it is determined that there is a possibility of a mounting defect at any of the component mounters, the use of at least one of the mounting head or the suction nozzle of that component mounter is prohibited, thus preventing any more circuit board mounting defects occurring at that component mounter. Further, because the ID of the at least one of the mounting head or the suction nozzle for which use has been prohibited is sent to the other component mounters, and those component mounters stop operation if the at least one of the mounting head or the suction nozzle for which use has been prohibited is attached, even if at least one of the mounting head or the suction nozzle for which use has been prohibited is attached to one of the other mounters, mounting of a component onto a circuit board by the at least one of the mounting head or the suction nozzle for which use has been prohibited is prevented.

Also, an inspection device configured to inspect a mounting accuracy of components mounted on the circuit board may be provided in the component mounting line, and the production management computer may be configured to, when it is determined that there is a possibility of a mounting defect at any of the component mounters, extract a mounting position of the component mounted on the circuit board as a mounting position for which there is a possibility of a mounting defect, and display the mounting accuracy of the component for which there is a possibility of a mounting defect based on a measurement result of the inspection device. Accordingly, it is easy for an operator to check whether the mounting accuracy of a component for which there is a possibility of a mounting defect is within a tolerance range.

DESCRIPTION OF EMBODIMENTS

Figure 1:
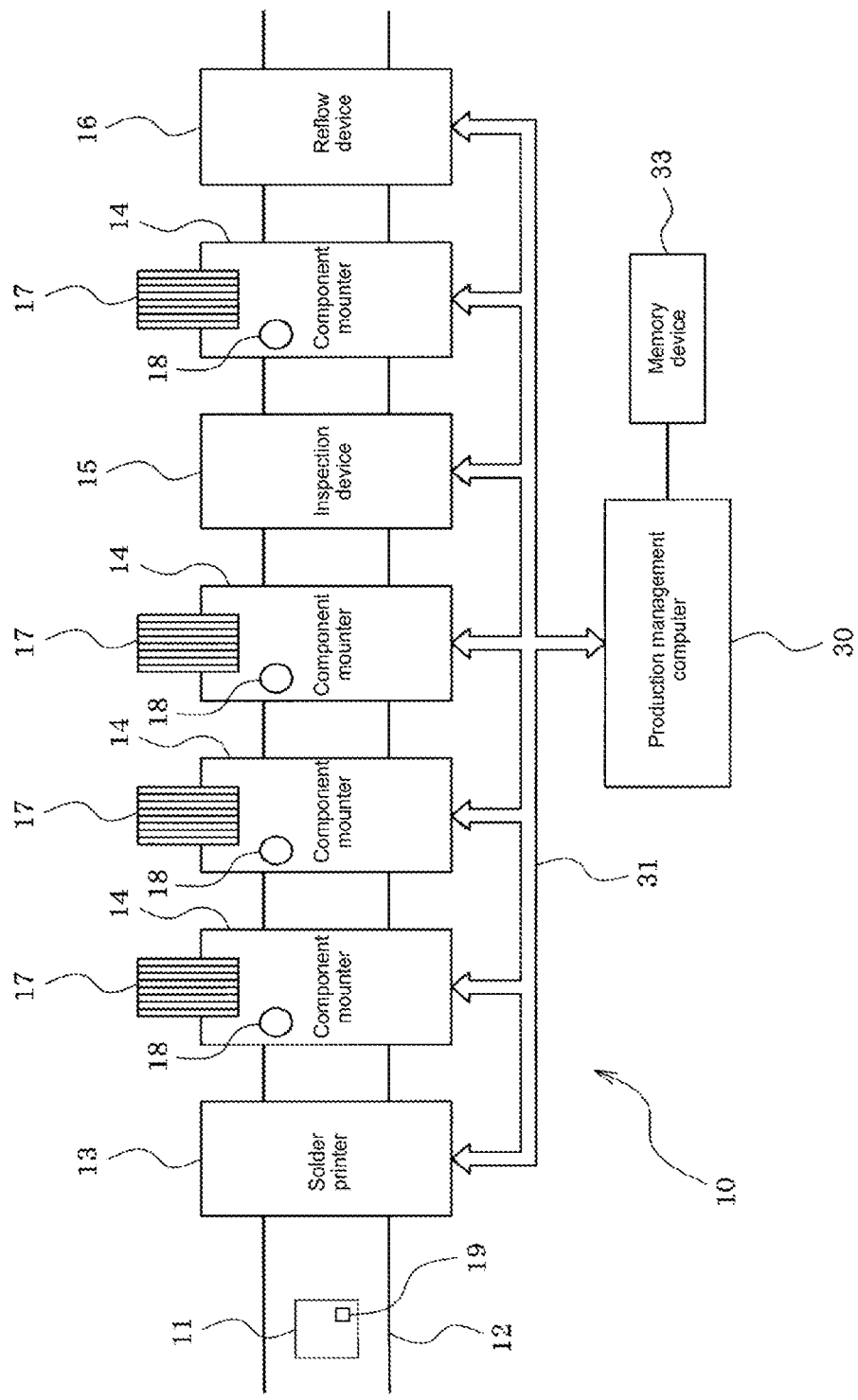
FIG. 1 is a block diagram showing schematically the configuration of a component mounting line of an embodiment of the present disclosure.

An embodiment of the disclosure is described below. First, the configuration of component mounting line 10 will be described based on FIG. 1.

Multiple component mounters 14 that mount components on circuit board 11 and mounting related machines that perform work related to component mounting are lined up along conveyance line 12 along which circuit board 11 is conveyed. Here, a mounting related machine may be, for example, solder printer 13, inspection device 15, reflow device 16, an adhesive applying device, or the like.

Multiple feeders 17 that each supply components are exchangeably loaded on a feeder setting table (not shown) of each component mounting machine 14. One or multiple suction nozzles (not shown) that pick up a component from feeders 17 and mount the component on circuit board 11 are exchangeably held on mounting head 18 of each component mounter 14.

Board ID recording section 19 on which is recorded (provided) or memorized board identification (also referred to as "board ID") is provided on an upper surface of circuit board 11 outside the region on which components are mounted. Board ID recording section 19 may be an item with a code such as a barcode or other 2-dimensional code recorded, an item that electronically records information such as an electronic tag, or an item that magnetically records information such as magnetic tape.

Similarly, an ID recording section (not shown) that records or memorizes identification information (also referred to as "ID") of a suction nozzle is provided on each of the suction nozzles of mounting head 18. This ID recording section may also be an item with a code such as a barcode or other 2-dimensional code recorded, an item that electronically records information such as an electronic tag, or an item that magnetically records information such as magnetic tape.

Figure 2:
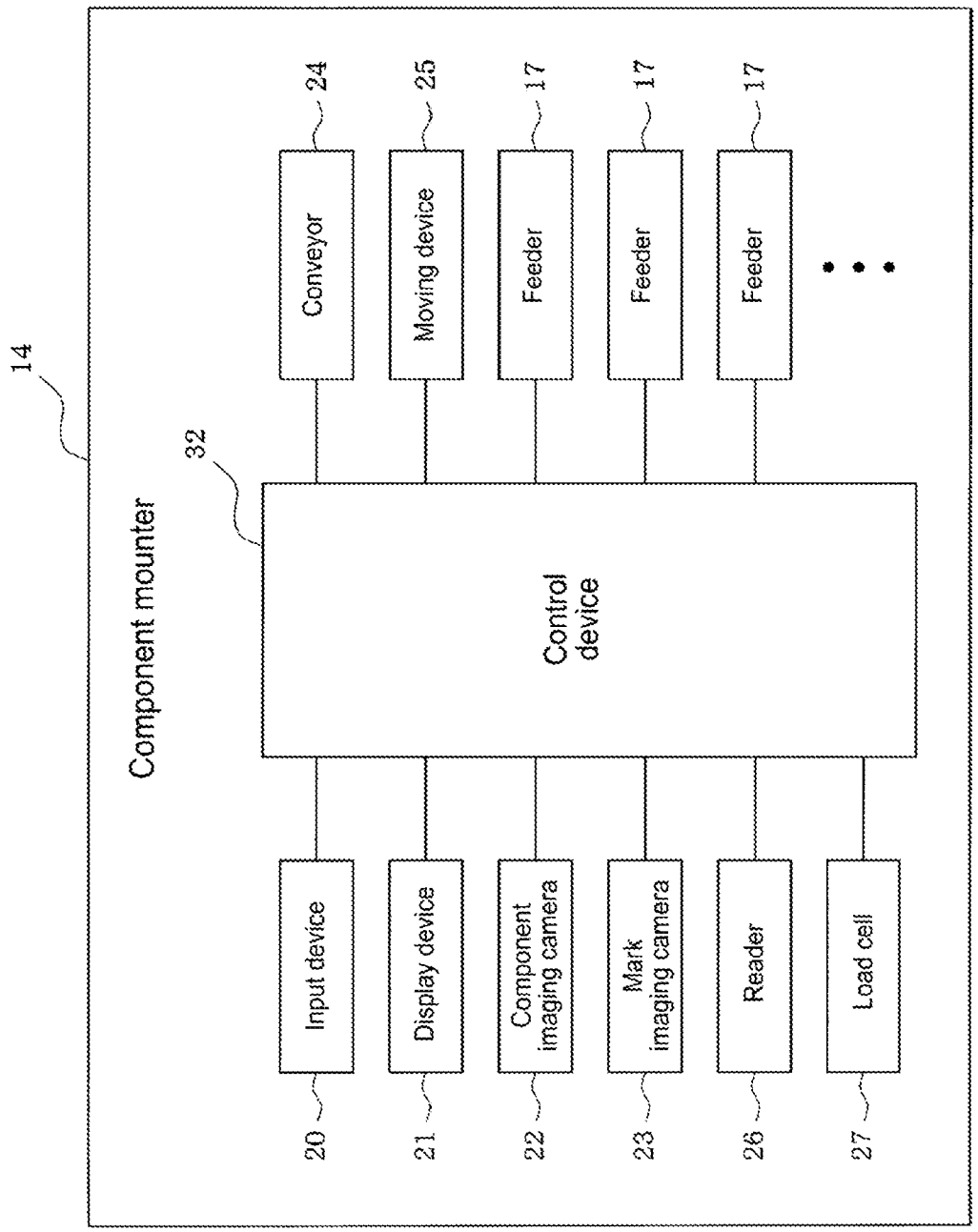
FIG. 2 is a block diagram showing the configuration of control items of a component mounter.

As shown in FIG. 2, provided in each component mounter 14 are items such as: input device 20 such as a keyboard, touch panel, and mouse; display device 21 such as an LCD or a CRT; component imaging camera 22 for capturing an image of a component held by a suction nozzle so as to recognize the component pickup orientation, the component pickup deviation, and the like; board imaging camera 23 for capturing an image of reference marks (not shown) of circuit board 11 and the like; conveyor 24 for conveying circuit board 11; and moving device 25 for moving mounting head 18 in XY directions (horizontal directions).

Also, reader 26 for reading the board ID from board ID recording section 19 of circuit board 11 is provided as an ID reading means on each component mounter 14. Reader 26 may be a shared ID reading means for reading the ID from an ID recording section of mounting head 18 and an ID recording section of the suction nozzle, or may be separate ID reading means for reading IDs of each item separately. Alternatively, IDs of each item may be read by using board imaging camera 23 or the like to image board ID recording section 19 of circuit board 11 and the ID recording sections of mounting head 18 and the suction nozzle and performing image processing.

Further, load cell 27 is provided on each component mounter 14 as a measuring means for measuring actual data for early-stage-discovery of a mounting defect (connection defect, component damage, or the like) at a specified measurement interval during production, with the suction nozzle being positioned above load cell 27 during production and lowered such that the lower end of the suction nozzle contacts load cell 27, the contact load (sliding resistance of the suction nozzle) being measured at load cell 27, and the measurement value being used to determine whether the suction nozzle is stuck or damaged.

Mounting related machines such as solder printer 13, inspection device 15, and reflow device 16 are also provided with ID reading means such as readers that read board IDs from board ID recording section 19 of circuit board 11.

As shown in FIG. 1, multiple component mounters 14 and the mounting related machines such as solder printer 13 and inspection device 15 that configure component mounting line 10 are connected to production management computer 30 that manages production of component mounting line 10 via network 31 such that communication is possible.

Control device 32 of each component mounter 14, in accordance with a production job (production program) sent from production management computer 30, moves mounting head 18 along a path from a component pickup position to a component imaging position then to a component mounting position so as to pick up a component supplied from a feeder 17 using a suction nozzle of mounting head 18, image the picked up component using component imaging camera 22 to recognize the component pickup position deviation amount and the like, and mount the component on circuit board, then repeats those operations to produce a circuit board 11 with a specified quantity of components mounted on it.

Multiple component mounters 14 and the mounting related machines such as the solder printer 13 and inspection device 15 that configure component mounting line 10 identify the board ID by using reader 26 or the like to read the board ID from board ID recording section 19 of the circuit board 11 that is loaded during production, send information of the identified board ID to production management computer 30, then production management computer 30 saves the board ID sent from the mounting related machines such as the multiple component mounters 14, solder printer 13, and inspection device 15 on re-writable non-volatile memory device 33 with a time stamp for each device (in other words, saves a board ID with time stamp linked to a device name on memory device 33). This makes it possible to investigate by checking past records the time of production and the board ID of circuit boards 11 mounted with components at each component mounter 14.

Further, at the multiple component mounters 14, at a specified measurement interval, the suction nozzle is moved above load cell 27 and lowered such that the lower end of the suction nozzle contacts load cell 27, the contact load (sliding resistance of the suction nozzle) is measured at load cell 27, and the measurement result sent to production management computer 30. Here, a "specified measurement interval" is, for example, one or a combination of: (1) every time a specified quantity of circuit boards 11 has been mounted with components; (2) a specified time interval; (3) every time a component pickup error ratio exceeds a specified value; (4) every time a mounting defect (connection defect, component damage, or the like) is detected by inspection device 15.

Production management computer 30 determines whether a suction nozzle is stuck or damaged based on the load measurement result of the pushing of the suction nozzle sent from each component mounter 14, and monitors whether there is a possibility of a mounting defect (connection defect, component damage, or the like) due to a stuck or damaged suction nozzle, and upon determining that there is a possibility of a mounting defect at one of the component mounters 14, references data saved on memory device 33, extracts board IDs of circuit boards 11 on which components were mounted at the component mounters 14 since the previous time measurement was performed based on the board IDs with time stamp saved and the measurement interval, and displays a list of the circuit boards 11 as "a list of circuit boards 11 for which it is possible that there is a mounting defect" on display device 21 of each component mounter 14.

In this case, the longer the interval between measurements for measuring actual data used for early-stage-discovery of a mounting defect, the longer the distance that a circuit board 11 that may have a mounting defect is conveyed, meaning that a portion of the circuit boards 11 for which a mounting defect may have occurred may have already been conveyed outside the component mounting line.

Here, production management computer 30 may include information of the current location of each of the circuit boards 11 in the list of circuit boards for which there is a possibility of a mounting defect that is displayed on display device 21 of each component mounter 14. As described above, because board IDs sent from each component mounter 14 and mounting related machine such as solder printer 13 are saved on memory device 33 with a time stamp for each device, by referencing this saved data it is possible to know the device name (current location information) to which the circuit board 11 for which there is a possibility of a mounting defect has been conveyed.

In this manner, if the list of circuit boards 11 for which there is a possibility of a mounting defect that is displayed on display device 21 of each component mounter 14 includes information of the current location of each circuit board 11, by checking the list of circuit boards 11 for which there is a possibility of a mounting defect, an operator can reliably and easily know to where the circuit boards 11 for which there is a possibility of a mounting defect have been conveyed.

In the present embodiment, the pushing amount of a suction nozzle is measured as the actual data for early-stage-discovery of a mounting defect, but, the suction nozzle may be imaged from the side by a camera and image processing performed to determine whether the suction nozzle is stuck or damaged. Further, the actual data for early-stage-discovery of a mounting defect is not limited to data related to a stuck or damaged suction nozzle, for example, the actual data may be obtained by measuring a mechanical positioning error amount or the like that causes a mounting defect.

Further, production management computer 30 is configured to, when it is determined that there is a possibility of a mounting defect at any of the component mounters 14, issue an instruction to stop operation to the component mounter 14 to which the circuit boards 11 included on the list of circuit boards 11 for which there is a possibility of a mounting defect have been loaded, such that operation of the component mounters 14 is stopped. This prevents components being mounted on a circuit board 11 with a mounting defect.

Also, in the present embodiment, the multiple component mounters 14, when exchanging both mounting head 18 and a suction nozzle, or only a suction nozzle, read the ID from the ID recording section of the suction nozzle or the ID recording section of mounting head 18, and send that information to production management computer 30. Also, production management computer 30 saves the ID of mounting head 18 or the ID of the suction nozzle sent from each component mounter 14 with a time stamp from each component mounter 14 on memory device 33, and if determining that there is a possibility of a mounting defect at any of the component mounters 14, prohibits use of the mounting head 18 or suction nozzle attached to the component mounter 14, and sends the ID of the suction nozzle or the ID of the mounting head for which use is prohibited to the other components mounters 14; the other component mounters 14, when the mounting head 18 or the suction nozzle for which use is prohibited is attached, stop operation, display on display device 21 that the mounting head 18 or the suction nozzle for which use is prohibited has been attached, so as to prompt an operator to exchange the mounting head 18 or the suction nozzle for which use is prohibited.

Accordingly, when it is determined that there is a possibility of a mounting defect at any of the component mounters 14, the use of at least one of the mounting head 18 or the suction nozzle of that component mounter 14 is prohibited, thus preventing any more circuit board 11 mounting defects occurring at that component mounter 14. Further, because the ID of the at least one of the mounting head 18 or the suction nozzle for which use has been prohibited is sent to the other component mounters 14, and those component mounters 14 stop operation if the at least one of the mounting head 18 or the suction nozzle for which use has been prohibited is attached, even if at least one of the mounting head 18 or the suction nozzle for which use has been prohibited is attached to one of the other mounters 14, mounting of a component onto a circuit board 11 by the at least one of the mounting head 18 or the suction nozzle for which use has been prohibited is prevented.

Further, inspection device 15 arranged in component mounting line 10 inspects the mounting accuracy of components mounted on circuit board 11, and sends the inspection result of the mounting accuracy of components to production management computer 30. Then, production management computer 30, when it is determined that there a possibility of a mounting defect at any of the component mounters 14, extracts a mounting position of the component mounted on the circuit board 11 as a mounting position for which there is a possibility of a mounting defect, and displays the mounting accuracy of the component for which there is a possibility of a mounting defect based on a measurement result of inspection device 15 on display device 21 of each component mounter 14. Accordingly, it is easy for an operator to check whether the mounting accuracy of a component for which there is a possibility of a mounting defect is within a tolerance range.

Production management of component mounting line 10 of the embodiment described above is performed according to the routines of FIGS. 3 to 7 by control device 32 of each component mounter 14, the control device of each of the mounting related machines such inspection device 15, and production management computer 30. Processing contents of the routines of FIGS. 3 to 7 are described below.

Component Mounter Routine (Number 1)

Figure 3:
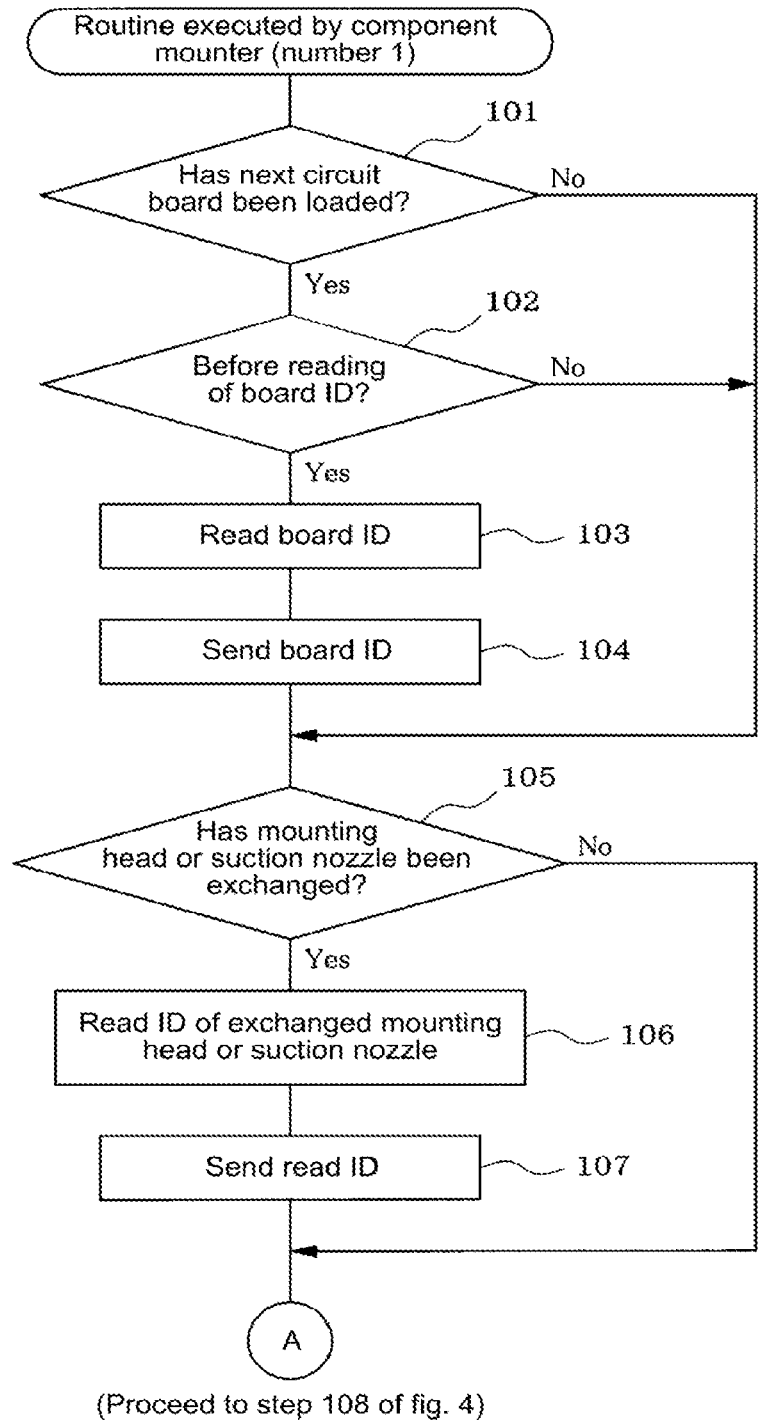
FIG. 3 is a flowchart of a former portion of processing of a (first) routine executed by a control device of each component mounter.
Figure 4:
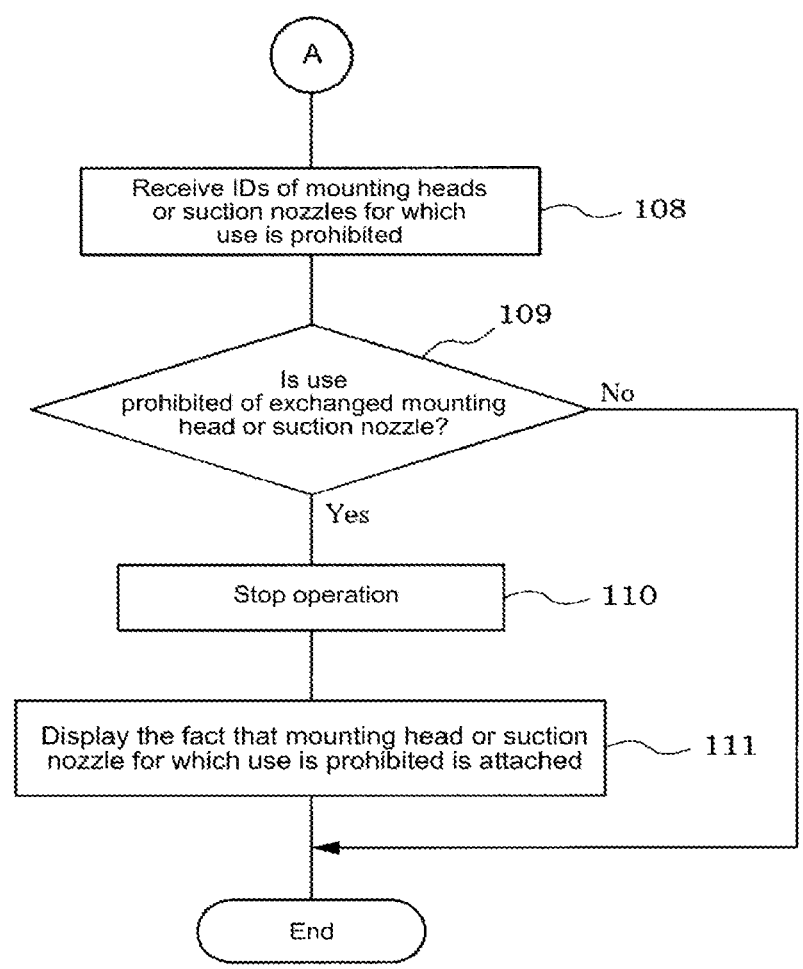
FIG. 4 is a flowchart of a latter portion of processing of a (first) routine executed by a control device of each component mounter.

The component mounter routine (number one) shown in FIGS. 3 and 4 is repeatedly executed on a specified cycle during production by control device 32 of each component mounter 14. When this routine is performed, first, in step 101, it is determined whether the next circuit board 11 has been conveyed, and if it is determined that the next circuit board 11 has not yet been conveyed, processing proceeds to step 105.

On the other, if it is determined in step 101 that the next circuit board 11 has been conveyed, proceeding to step 102, it is determined whether it is prior to reading the board ID of the circuit board 11, and if it is prior to reading the board ID, processing proceeds to step 103, reader 26 reads the board ID from board ID recording section 19 of circuit board 11, then, in step 104, sends the board ID to production management computer 30, after which processing proceeds to step 105. In step 102, if it is determined that reading of board IDs of circuit board 11 is complete, because the processing of steps 103 and 104 is not required, processing proceeds to step 105. The processing of steps 101 to 104 above is performed in a similar manner by the control device of mounting related machines such as inspection device 15.

In step 105, it is determined whether at least one of mounting head 18 or the suction nozzle has been exchanged, and if it is determined that neither one of mounting head 18 and the suction nozzle has been exchanged, processing proceeds to step 108 of FIG. 4. On the other hand, in step 105, if it is determined that at least one of mounting head 18 or the suction nozzle has been exchanged, proceeding to step 106, the ID is read from the ID recording section of the at least one of the mounting head 18 or the suction nozzle, then, in step 107, the read ID is sent to production management computer 30, after which processing proceeds to step 108 of FIG. 4.

After receiving the ID of the at least one of mounting head 18 or the suction nozzle for which use is prohibited sent from production management computer 30 in step 108 of FIG. 4, proceeding to step 109, by checking whether the ID of the exchanged mounting head 18 or suction nozzle matches an ID for which use is prohibited, it is determined whether use of the exchanged mounting head 18 or suction nozzle is prohibited. If it is determined that use of the exchanged mounting head 18 or suction nozzle is prohibited, proceeding to step 110, operation of the component mounter 14 is stopped, then, proceeding to step 111, the fact that a mounting head 18 or suction nozzle for which use is prohibited has been attached is displayed on display device 21 so as to prompt an operator to remove the mounting head 18 or suction nozzle for which use is prohibited, then the routine ends. If it is determined in step 109 that use of the exchanged mounting head 18 and suction nozzle is not prohibited, the program ends without further processing.

Component Mounter Routine (Number 2)

Figure 5:
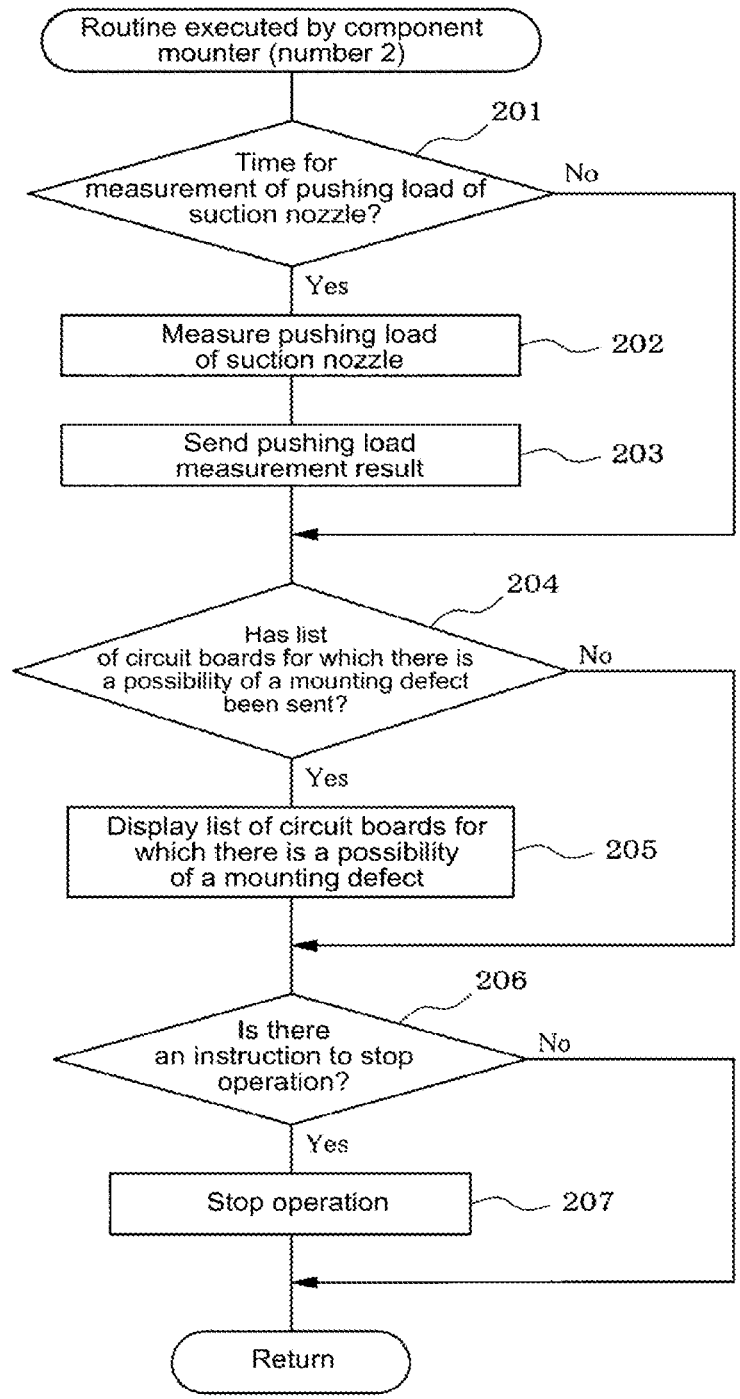
FIG. 5 is a flowchart of processing of a (second) routine executed by a control device of each component mounter.

The component mounter routine (number two) shown in FIG. 5 is repeatedly executed on a specified cycle during production by control device 32 of each component mounter 14. When the routine is started, first, in step 201, by checking whether the specified time has elapsed since the previous load measurement of the suction nozzle, it is determined whether it is time to perform load measurement of the suction nozzle. If it is determined that it is time to perform measurement, proceeding to step 202, the suction nozzle is moved above load cell 27 and lowered such that the lower end of the suction nozzle contacts load cell 27 and the contact load is measured at load cell 27, then, proceeding to step 203, the measurement result of the load of the suction nozzle is sent to production management computer 30 and processing proceeds to step 204. On the other hand, in step 201, if it is determined that it is not time to perform measurement of the pushing load of the suction nozzle, processing proceeds to step 204 without performing steps 202 and 203.

In step 204, it is determined whether the list of circuit boards 11 for which there is a possibility of a mounting defect has been sent from production management computer 30, and if the list has been sent, proceeding to step 205, the list of circuit boards 11 for which there is a possibility of a mounting defect is displayed on display device 21, then processing proceeds to step 206. Here, information of the current location of each circuit board 11 and the mounting accuracy of components for which there is a possibility of a mounting defect are displayed in the list of circuit boards 11 for which there is a possibility of a mounting defect. On the other hand, if it is determined in step 204 that the list of circuit boards 11 for which there is a possibility of a mounting defect has not been sent from production management computer 30, processing proceeds to step 206 without displaying the list as in step 205.

In step 206, it is determined whether an instruction to stop operation has been received from production management computer 30, and if an instruction to stop operation has been received, processing proceeds to step 207, operation of the component mounter 14 is stopped, an indication of this is displayed on display device 21, then the routine ends. In step 206, if it is determined that there is not an instruction to stop operation, the routine ends without further processing.

Production Management Computer Routine

Figure 6:
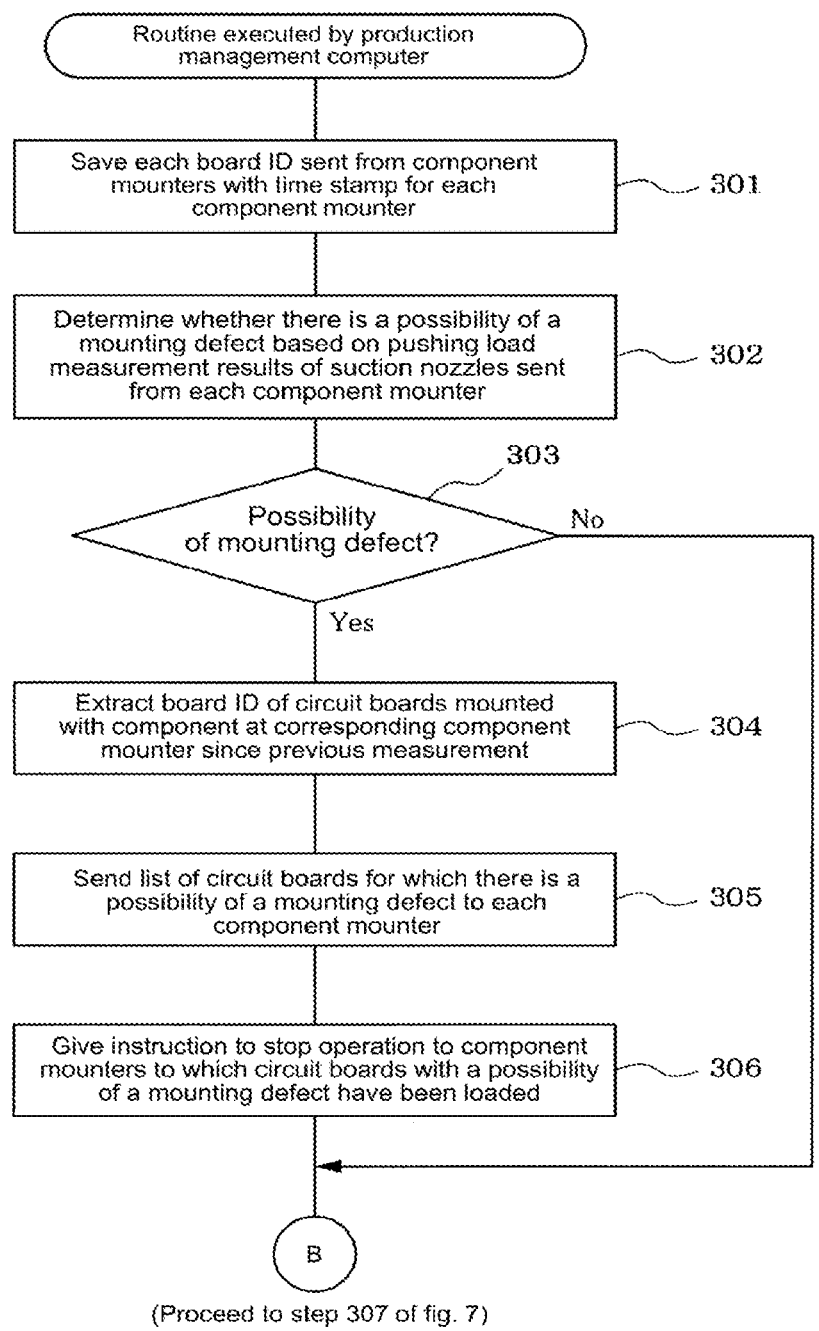
FIG. 6 is a flowchart of a former portion of processing of a routine executed by a production management computer.
Figure 7:
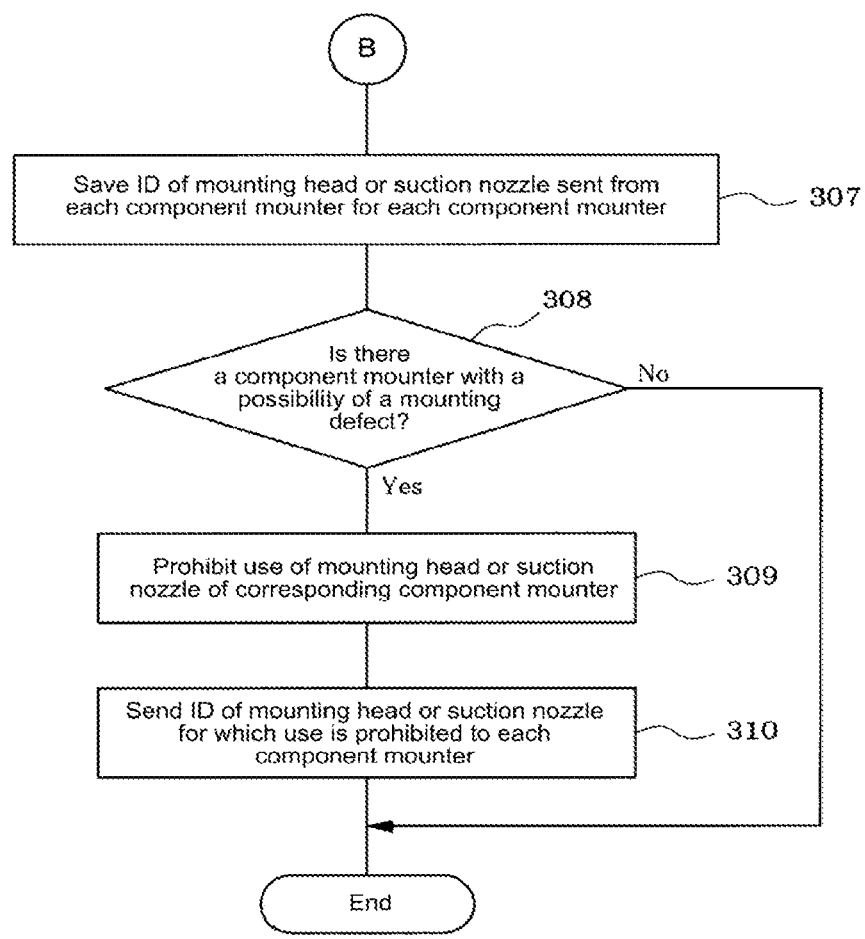
FIG. 7 is a flowchart of a latter portion of processing of a routine executed by a production management computer.

The production management computer routine shown in FIGS. 6 and 7 is repeatedly executed on a specified schedule during production by production management computer 30. When the routine is started, first, in step 301, the board ID sent from each component mounter 14 and mounting related machine such as inspection device 15 is saved on memory device 33 with a time stamp from each component mounter 14 (that is, a board ID with a time stamp is saved on memory device 33 linked to a device name).

Then, proceeding to step 302, it is determined whether the suction nozzle is stuck or damaged based on the load measurement result of the suction nozzle sent from each component mounter 14, then it is determined whether there is a possibility of a mounting defect due to the stuck or damaged nozzle. As a result, if it is determined that there is a possibility of a mounting defect, processing proceeds from step 303 to step 304, the data saved on memory device 33 is referenced, and based on the board IDs with the time stamp and the measurement interval, board IDs of circuit boards 11 on which components have been mounted at the component mounter 14 since the previous measurement are extracted, then, in step 305, a list of the circuit boards 11 is sent to each component mounter 14 as a "list of circuit boards for which it is possible that there is a mounting defect." Then, in step 306, an instruction to stop operation is issued for component mounters 14 to which circuit boards 11 included on the list of circuit boards for which it is possible that there is a mounting defect have been loaded, then processing proceeds to step 307 of FIG. 7. On the other hand, if it is determined in step 303 that there is no possibility of a mounting defect, processing proceeds to step 307 of FIG. 7 without performing the processing of steps 304 to 306.

In step 307 of FIG. 7, the ID of at least one of the mounting head 18 or suction nozzle sent from each component mounter 14 is saved on memory device 33 with a time stamp for each component mounter 14, then, in step 308, from the determination of step 303, it is determined whether there is a component mounter 14 for which there is a new possibility of a mounting defect. If it is determined that there is a component mounter 14 for which there is a new possibility of a mounting defect, proceeding to step 309, the status of at least one of the mounting head 18 or suction nozzle attached to that component mounter 14 is set to use prohibited, then, in step 310, the ID of the mounting head 18 or suction nozzle for which use is prohibited is sent to each component mounter 14, then the routine ends. Note that, in step 308, if it is determined that there are no component mounters 14 for which there is a new possibility of a mounting defect, the program ends without further processing.

According to an embodiment described above, by creating a state in which it is possible to investigate by checking past records the time of production and the board ID of circuit boards 11 mounted with components at each component mounter 14 by saving board IDs sent from the multiple component mounters 14 with a time stamp from each component mounter 14, when production management computer 30 determines that there is a possibility of a mounting defect at one of the component mounters 14, production management computer 30 references the saved date of the board IDs with time stamp saved for each component mounter 14, extracts board IDs of circuit boards 11 on which components have been mounted by the component mounter 14 since the previous measurement, and displays a list of the circuit boards 11 as a list of boards for which it is possible that there is a mounting defect, thus, when it becomes clear from the current measurement result that there is a possibility of a mounting defect at one of the component mounters 14, it is possible for an operator to reliably and easily know a list of circuit boards 11 for which a mounting defect may have occurred which may have been conveyed to a downstream component mounter 14, thereby enabling the operator to efficiently collect and inspect circuit boards 11 for which there is a possibility of a mounting defect.

Note that, in an embodiment above, the list of circuit boards 11 for which a mounting defect may have occurred is displayed on display device 21, but the list may be displayed on a display device of production management computer 30, or, so long as the display device is positioned so as to be viewable by an operator, the list of circuit boards 11 for which a mounting defect may have occurred may be displayed in any manner.

Also, in an embodiment above, reader 26 is provided for each component mounter 14, and the board ID is identified by reading the board ID from board ID recording section 19 of circuit board 11, however, the configuration is not limited to this, for example, a method in which a reader is provided at the component mounter 14 furthest upstream or at a location even further upstream than this, and information of the board ID read by this reader is sent from upstream to a downstream component mounter 14 via network 31, or other such method of each component mounter 14 identifying the board ID may be employed.

Further, the present disclosure is not limited to the embodiments described above and it goes without saying that various embodiments with changes that do not extend beyond the scope of the disclosure are possible, such as that suitable changes may be made to the configuration of component mounting line 10.

REFERENCE SIGNS LIST

10: component mounting line;
11: circuit board;
12: conveyance path;
14: component mounter;
15: inspection device;
17: feeder;
18: mounting head;
21: display device;
26: reader;
27: load cell;
30; production management computer;
32: control device;
33: memory device

The invention claimed is:
1. A production management system of a component mounting line, comprising:
   a component mounter arranged in a line on a conveyance path along which a circuit board is conveyed, the component mounter including a suction nozzle configured to mount components supplied from a component supply device on to the circuit board;
   a production management computer connected to the component mounter via a network of the production management system, wherein
   a board ID recording section on which is recorded or memorized a board identification information "board ID" provided on the circuit board conveyed in the component mounting line,
   the component mounter is configured to
      identify the board ID of the circuit board that is loaded during production and send the board ID and a time stamp to the production management computer,
      measure actual machine data for early-stage-discovery of a mounting defect at a specified measurement interval during production, and
      send a measurement result of the measuring to the production management computer, and
   the production management computer is configured to
      save the board ID with the time stamp sent from the component mounter,
      monitor whether there is a possibility of a mounting defect based on the measurement result of the actual machine data for early-stage-discovery of a mounting defect for the component mounter,
      when determining that there is the possibility of the mounting defect at the component mounter, extract the board IDs of previous circuit boards on which components were mounted at the component mounter since a previous time that measurement was performed, based on the measurement interval and the board ID with time stamp, and display a list of the previous circuit boards as a list of circuit boards for which there is the possibility of the mounting defect.

2. The production management system of the component mounting line according to claim 1, wherein the production management computer includes information of a current location of each of the previous circuit boards in the list of circuit boards for which there is the possibility of the mounting defect.

3. The production management system of the component mounting line according to claim 1, wherein the component mounter is configured to measure a pushing load of the suction nozzle as the actual machine data for early-stage-discovery of the mounting defect.

4. The production management system of the component mounting line according to claim 1, wherein the production management computer is configured to display the list of circuit boards for which there is the possibility of the mounting defect on a display section of the component mounter.

5. The production management system of the component mounting line according to claim 1, wherein the production management computer is configured to, when it is determined that there is the possibility of the mounting defect at the component mounter, issue an instruction to stop operation to the component mounter to which the previous circuit boards included on the list of circuit boards for which there is the possibility of the mounting defect have been loaded.

6. The production management system of the component mounting line according to claim 1, wherein the component mounter includes a mounting head that exchangeably holds the suction nozzle, and a second ID recording section on which is recorded or memorized a second ID provided on at least one of the mounting head or the suction nozzle, the component mounter is configured to read the second ID from the second ID recording section of the at least one of the mounting head or the suction nozzle when the at least one of the mounting head or the suction nozzle is exchanged, and send the second ID to the production management computer, and the production management computer is configured to save the second ID of the at least one of the mounting head or the suction nozzle sent from the component mounter, prohibit use of the at least one of the mounting head or the suction nozzle attached to the component mounter at a time when it is determined that there is the possibility of the mounting defect at the component mounter, send the second ID of the at least one of the mounting head or the suction nozzle for which use is prohibited to other component mounters of the component mounting line, stop operation of the other component mounters arranged in the line when the at least one of the mounting head or the suction nozzle for which use is prohibited is attached to one of the other component mounters, and to display an indication that operation of that other component mounter has stopped.

7. The production management system of the component mounting line according to claim 1, further comprising:

an inspection device arranged in the line and configured to inspect a mounting accuracy of components mounted on the circuit board, wherein the production management computer is configured to, when it is determined that there is the possibility of the mounting defect at the component mounter, extract a mounting position of the component mounted on the circuit board as a mounting position for which there is the possibility of the mounting defect, and display the mounting accuracy of the component for which there is the possibility of the mounting defect based on a measurement result of the inspection device.

* * * * *